United States Patent [19]

Roehrlein et al.

[11] Patent Number: 4,983,912
[45] Date of Patent: Jan. 8, 1991

[54] METHOD FOR CALIBRATING SQUID GRADIOMETERS OF AN ARBITRARY ORDER

[75] Inventors: Gerhard Roehrlein, Hoechstadt; Heinrich Seifert, Bubenreuth, both of Fed. Rep. of Germany

[73] Assignee: Siemens Aktiengesellschaft, Berlin and Munich, Fed. Rep. of Germany

[21] Appl. No.: 498,617

[22] Filed: Mar. 26, 1990

[30] Foreign Application Priority Data

Mar. 29, 1989 [EP] European Pat. Off. ............ 89105569

[51] Int. Cl.$^5$ ............................................ G01R 35/00
[52] U.S. Cl. .................................... 324/202; 324/248; 505/845
[58] Field of Search ................ 324/202, 248, 244, 260, 324/261; 505/845, 846, 705

[56] References Cited

U.S. PATENT DOCUMENTS

| | | | |
|---|---|---|---|
| 3,980,076 | 9/1976 | Wikswo, Jr. et al. | 324/248 X |
| 4,079,730 | 3/1978 | Wikswo, Jr. et al. | 324/224 X |
| 4,109,199 | 8/1978 | Ball et al. | 324/202 |
| 4,349,781 | 9/1982 | Vozoff | 324/346 |
| 4,549,135 | 10/1985 | Vaidya | 324/248 |
| 4,646,025 | 2/1987 | Martin et al. | 324/248 X |

FOREIGN PATENT DOCUMENTS 2115552 9/1983 United Kingdom.

OTHER PUBLICATIONS

Ribeiro et al., "Squid Arrays for Simultaneous Magnetic Measurements: Calibration and Source Localization Performance", pp. 551–560, I.E.E.E. Transactions on Biomedical Engr., vol. 35, No. 7, 12/1988.
Romani et al., "Biomagnetic Instrumentation", Rev. Sci. Instrum., pp. 1815–1845, vol. 53, No. 12, 12/1982.
Patent Abstracts of Japan (P-483), Aug. 31, 1985.

*Primary Examiner*—Reinhard J. Eisenzopf
*Assistant Examiner*—Warren S. Edmonds
*Attorney, Agent, or Firm*—Hill, Van Santen, Steadman & Simpson

[57] ABSTRACT

In a method for calibrating multi-channel SQUID systems having gradiometers of an arbitrary order, calibration coils, each having the same number of ampere turns are symmetrically arranged at identical distances between the parallel coil planes with respect to every gradiometer coil, so that every gradiometer coil is penetrated by a common, oppositely directed magnetic field generated by the calibration coils. The field that the calibration coils produce at the locations of the gradiometer coils are numerically calculated to obtain a net gradient field value which is divided by the measured voltage at the output of the allocated SQUID electronics in order to calculate the calibration factor.

6 Claims, 3 Drawing Sheets

METHOD FOR CALIBRATING SQUID GRADIOMETERS OF AN ARBITRARY ORDER

BACKGROUND OF THE INVENTION

1. Field of the Invention

The invention is directed to a method for calibrating a SQUID gradiometer of an arbitrary order. More specifically, the invention is directed to calibrating SQUID gradiometers of an arbitrary order in a multi-channel SQUID system by inducing a magnetic field in such a manner so that the uniform field components at the pick-up and compensation coils of the gradiometer are equal to zero while the gradient field components are specifically known values.

2. Description of the Related Art

Superconducting quantum interference device (SQUID) gradiometers are used to measure weak magnetic fields and isolate the location of the field source. In particular, multi-channel systems of this type are utilized extensively in medical technology for measuring the magnetic fields emanating from the brain and heart. These magnetic signals are required for preparing magnetoencephalograms (MEG) and magnetocardiograns (MKG) in order to acquire the chronological curve of action streams of these organs and their spatial allocation.

Before the location of a field source can be isolated with the assistance of multi-channel SQUID gradiometer system, an exact calibration of each of the gradiometers must be obtained. An exact calibration entails a determination of the ratio between the magnetic flux density at the sensor coil (pickup coil) and the electrical voltage at the output of the drive electronics of the SQUID system. This ratio is referred to as the calibration factor of the gradiometer.

A known method for calibrating a multi-channel system of this species is described in *IEE Transactions on Biomedical Engineering* (in Press 1988) under the title "SQUID ARRAYS FOR SIMULTANEOUS MAGNETIC MEASUREMENTS; CALIBRATION AND SOURCE LOCALIZATION PERFORMANCE" by P. Costa Ribeiro, S. J. Williamson and L. Kaufman. This method is capable of obtaining a precision of approximately 2%, this precision being significantly greater than the 10% precision associated with the prior methods.

The method describes its use as applied to an ideal gradiometer that does not have any mis-match [or mis-balance] resulting from the uniform part of the applied field. A real gradiometer, however, has such a mis-match [or mis-balance]. This mis-match [or mis-balance] causes a voltage Vf at the output of the gradiometer resulting from the uniform part of the applied calibration field. The voltage Vf falsifies the measuring voltage V, the voltage Vf increasing in the case of second and higher order gradiometers.

Although it is in fact possible to calculate the voltage Vf if the mis-match factor f is known (it is possible to subtract it from the measuring voltage V), an exact measurement of the mis-match factor f is extremely complicated. Namely, a very uniform magnetic field must be generated and exact field o gradients up to the (n−1)th order must also be generated for gradiometers of the nth order.

SUMMARY OF THE INvENTION

One of the objects of the present invention is to avoid the complications associated with generating a very uniform magnetic by setting forth a calibration method wherein a gradiometer mis-match does not enter into the calibration measurement. This object is achieved in that every gradiometer coil (pickup coil, compensation coil, etc.) is commonly penetrated the by oppositely directed magnetic fields produced by two calibration coils, each calibration coil having the same number of ampere turns. These calibration coils are arranged symmetrically about the axis of the gradiometer coils as well as at identical distances therefrom.

The field that is produced by the calibration coils at the locations of the gradiometer coils is numerically calculated to obtain a net gradient field value. The calculated net gradient field value is then divided by the voltage measured at the output of the SQUID electronics to calculate the calibration factor.

BRIEF DESCRIPTION OF THE DRAWINGS

Other objects, features, and advantages of the invention, will best be understood from the following detailed description, taken in conjunction with the accompanying drawings, on which.

DESCRIPTION OF THE PREFERRED EMBODIMENT

Figure 1:
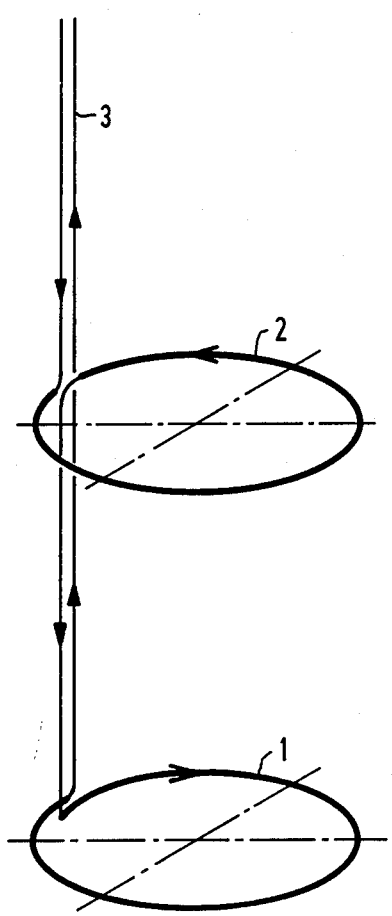
FIG. 1 shows the coils of a gradiometer of the first order.

FIG. 1 is a schematic representation showing the coil arrangement of an axial gradiometer of the first order. Such a gradiometer comprises two coils, an upper coil and a lower coil, which are arranged at an axial distance from one another and which are electrically connected in series. The coils are thus arranged so that their respective coil planes lie parallel to one another. The lower coil is allocated to the magnetic field to be measured and is referred to as a pick-up coil 1. The upper coil is a compensation coil 2 which is placed in relatively close proximity with the pick-up coil 1 so that any uniform magnetic fields generated by remote sources penetrate both coils. The opposite directions of the coil windings compensate for the presence of the uniform magnetic field. The two coils are connected via an inductive coupling to a superconducting quantum inference device (SQUID) and are surrounded by a Dewar vessel containing liquid hydrogen to hold the vessel at a temperature of 4.2° K. The structure and the function of such a first order gradiometer is described in the periodical "Bild der Wissenschaft", No. 8, 1986, pages 76–83 and therefore requires no further explanation.

Figure 2:
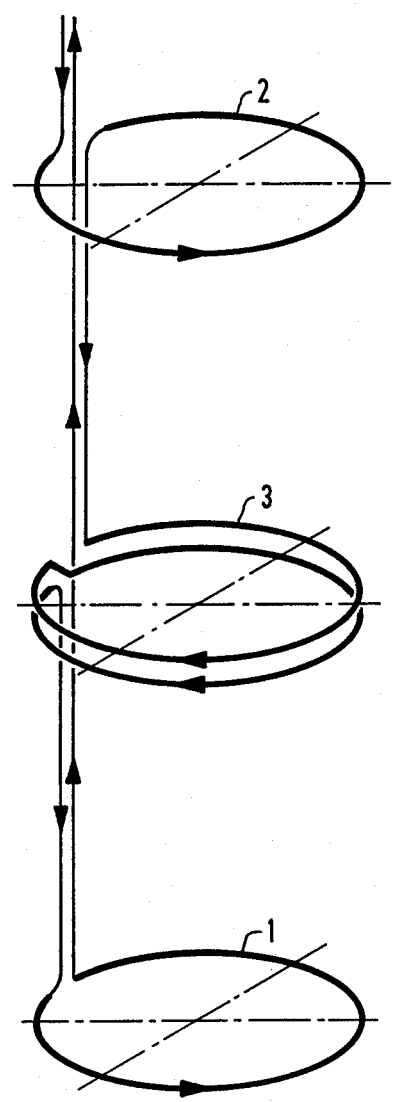
FIG. 2 shows a the coils of a gradiometer of the second order.

The coil arrangement of a second order gradiometer is shown in FIG. 2. As can be seen in the figure, a second order gradiometer has a central coil 3 arranged between the two and coils 1 and 2. The central coil has two windings which are isodirectionally wound and are electrically connected in series. The winding sense of the two windings of the central coil 3 is opposite that of the pickup coil 1 and the compensation coil 2. The winding sense of the compensation coil 2 is thus isodirectional with that of the pickup coil 1. All three coils are electrically connected in series and are inductively coupled to the allocated SQUID (not shown).

The calibration of such a second order gradiometer is described in *IEEE Transactions in Biomedical Engineering* under the title "SQUID ARRAYS FOR SIMULTANEOUS MAGNETIC MEASUREMENTS; CALIBRATION AND SOURCE LOCALIZATION PERFORMANCE" by P. Costa Ribeiro, S. J. Williamson and L. Kaufman, page 3 under A., "Large-Coil Calibration Technique". The calibration method described in this work utilizes a calibration coil that is arranged in the plane of the pick-up coil 1 to generate a magnetic field that, given a gradiometer of the first order, penetrates both the pick-up coil 1 and the compensation coil 2 with different strength. The magnitude of the field strengths in the plane of the pick-up coil 1 and of the compensation coil 2 is numerically calculated. The difference between the two field strengths is then divided by the measuring voltage V arising at the output of the pickup amplifier. The value obtained in this way is what is referred to as the calibration factor k.

A real gradiometer, however, has a mis-match which effects the current generated by the two coils. The mis-match causes the current generated by the two coils as a result of the magnetic fields to deviate from the current actually generated due to the gradient field. The degree of deviation can be expressed as a fault voltage Vf that falsifies the measuring voltage V. If the mis-match factor f is determined with precision, the fault voltage Vf can be calculated and subtracted from the measuring voltage V to compensate for the mis-match. An exact measurement of the mis-match factor f, however, is extremely involved because it requires the generation of a very uniform compensation magnetic field and, for gradiometers of the nth order, additionally requires exact field gradients up to the (n−1)th order.

Figure 3:
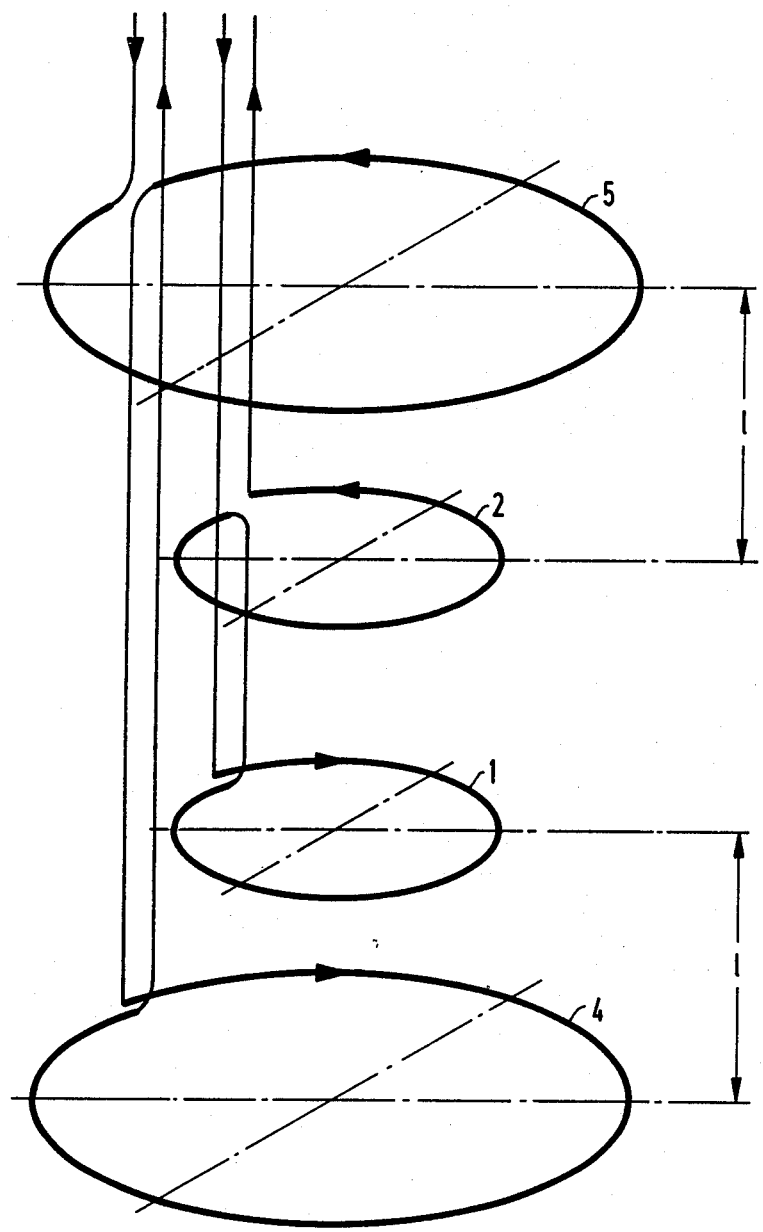
FIG. 3 shows a gradiometer of the first order having allocated calibration coils in accordance with the method of the invention.

An identical degree of precision can be obtained with the calibration coil arrangement shown in FIG. 3. This arrangement allows calibration without the extensive outlay of the prior arrangements.

The arrangement of FIG. 3 shows a first order gradiometer such as is shown in FIG. 1. In such an arrangement, it is first assumed that the fault voltage Vf is produced by the uniform magnetic field parts in the coil planes. This uniform part Bh is the sum of the magnetic fields in the planes of the participating coils: $Bh = B1 + B2$, whereby B1 is the field in the plane of the pick-up coil 1 and B2 is the field in the plane of the compensation coil 2. When care is exercised to see that the uniform field component is negligible, i.e. is zero, then a gradiometer mis-match does not enter into the calibration measurement.

Such calibration can be achieved with the arrangement of FIG. 3 as applied to a gradiometer of the first order. The calibration coils 4 and 5 are arranged in an axially symmetric manner with the coil planes of coils 1 and 2 and, further, have identical spacings 1 from the coil planes. The coil planes lie parallel to one another. As shown, the coils are placed at the exterior axial portion of the gradiometer, the interior axial portions being defined by the axial region between the planes of coils 1 and 2. The calibration coils 4 and 5 are electrically connected in series and have the same number of turns. The winding senses of the calibration coils 4 and 5 are directed in opposing directions (see the respective arrows).

Figure 4:
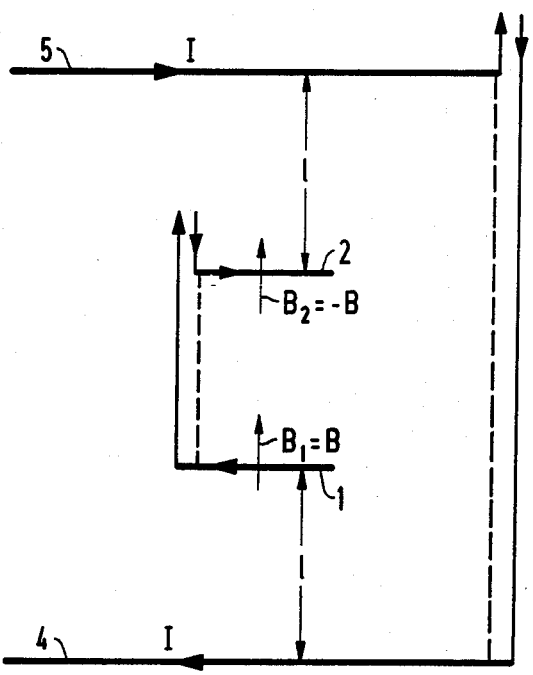
FIG. 4 is a schematic illustration of a calibration arrangement for a gradiometer of the first order in accordance with the method of invention.

FIG. 4 shows the arrangement of FIG. 3 in a highly schematic fashion. The alternating current I flowing through the calibration coils 4 and 5 generates a field $B1 = B$ at the pick-up coil 1 of the gradiometer and generates a field $B2 = -B$ at the compensation coil 2. Consequently, the uniform field component Bh is:

$$Bh = B1 + B2 = B - B = 0.$$

Thus, the only component having a significant effect on the calibration is the first field gradient Bg1:

$$Bg1 = B1 - B2 = B - (-B) = 2B.$$

For the calibration, the field gradient across the gradiometer coils is calculated and is divided by the measured voltage V at the output of the SQUID electronics to obtain the necessary calibration constant.

Figure 5:
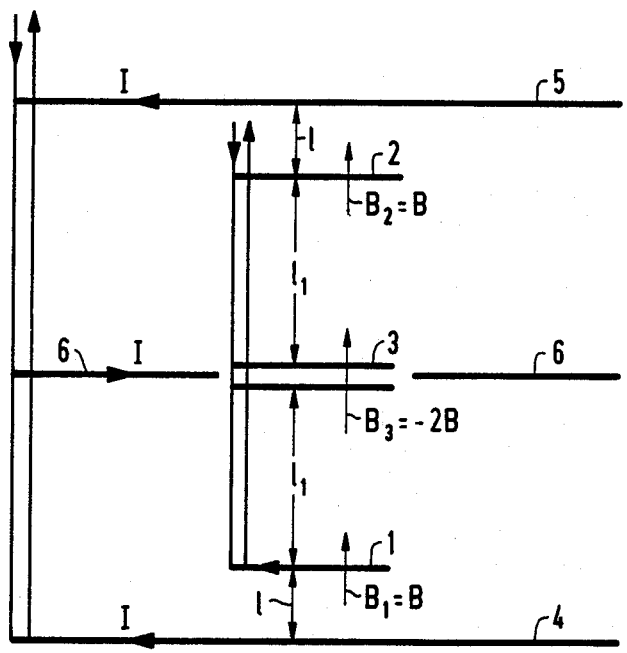
FIG. 5 is a schematic illustration of a calibration arrangement for a gradiometer of the second order in accordance with the method of the invention.

FIG. 5 shows the calibration arrangement for a second order gradiometer such as shown in FIG. 2. A further calibration coil 6 lies in the plane of the central coil 3. The spacings between the pick-up coil 1 and the central coil 3 as well as between the central coil 3 and the compensation coil 2 are referenced 11. Care must be exercised in this arrangement to see that both the uniform magnetic field Bh across the gradiometer coils as well as the first order gradient Bg1 are zero. Thus, the arrangement must conform to the following equations:

$$Bh = B1 + B2 + B3 = 0$$

$$Bg1 = (b1 - B3) + (B3 - B2) = B1 - B2 = 0.$$

The second order gradient Bg2 is measured at the gradiometer:

$$Bg2 = (B1 - B3) - (B3 - B2) = B1 - 2B3 + B2.$$

In order for such an arrangement to conform to the requirements that $Bh = 0$ and $Bg1 = 0$, the arrangement of the calibration coils 4, 5, and 6 must generate the following field distribution at the gradiometer:

$$B1 = B; \; B3 = B \text{ and } B2 = = 2 B.$$

Based on these equations, the following may be derived:

$$Bg2 = 6 B; \; Bg1 = 0 \text{ and } Bh = 0.$$

This field distribution can be generated by three or more calibration coils which are arranged to be symmetrically distributed in height around the gradiometer coils. The spacings of the calibration coils from the gradiometer coils and the ratio of the number of turns between the calibration coils are critical. The calibration coils employed can be arbitrary in shape as long as the generated magnetic field can be numerically or analytically calculated at the locations of the gradiometer coils.

The disclosed principle can be expanded to gradiometers of an arbitrarily higher order. For gradiometers of the nth order, care must merely be exercised to see that the field distributions generated by the calibration coils are selected such that the field gradients become zero up to the (n−1)th order. The field distribution required for this purpose can be directly calculated from the equation for the field gradients that the respective gradiometer measures. In order to generate this magnetic field distribution, at least (n+1) calibration coils are required, whereby n is the order of the gradiometer.

Although modifications and changes may be suggested by those skilled in the art, it is the intention of the inventors to embody within the patent warranted hereon all changes and modifications as reasonably and properly come within the scope of their contribution to the art.

We claim:

1. A method for calibrating a SQUID gradiometer of an arbitrary order, said method comprising the steps of:
   providing an nth-order gradiometer associated with a respective SQUID, said nth-order gradiometer having gradiometer coils;
   providing a plurality of calibration coils;
   commonly penetrating each of said gradiometer coils by magnetic fields respectively generated by each of two calibration coils of said plurality of calibration coils, each of said two calibration coils generating opposing magnetic fields so as to produce a magnetic field across said gradiometer coils having a net uniform magnetic field component as well as gradient magnetic field components up to and including gradient magnetic field components of an (n−1)th order which are negligible.

2. A method as recited in claim 1, further comprising the steps of:
   numerically calculating a net gradient magnetic field value produced by said plurality of calibration coils across said gradiometer coils;
   measuring an output voltage at said respective SQUID; and,
   dividing said net magnetic field value by said output voltage to calculate a calibration factor.

3. A method for calibrating a SQUID system having a first order gradiometer, said method comprising the steps of:
   providing a first-order gradiometer associated with a respective SQUID, said first-order gradiometer having a pick-up coil and a compensation coil;
   placing a first calibration coil having a first winding sense at an exterior axial portion of said first-order gradiometer at a first distance from said pick-up coil, coil planes of said first calibration coil and said pick-up coil lying parallel to one another;
   placing a second calibration coil having a second winding sense opposite said first winding sense at an exterior axial portion of said first-order gradiometer at a second distance from said compensation coil, said first distance being equal to said second distance, coil planes of said second calibration coil and said compensation coil lying parallel to one another, said first and second calibration coils having an identical number of ampere turns;
   penetrating each of said pick-up and compensation coils with magnetic fields respectively generated by said first and second calibration coils so as to produce a net uniform magnetic field component across said detection and compensation coils which is negligible.

4. A method as recited in claim 3, further comprising the steps of:
   numerically calculating a net gradient magnetic field value produced across said pick-up and compensation coils by said first and second calibration coils;
   measuring an output voltage at said respective SQUID; and,
   dividing said net magnetic field value by said output voltage to calculate a calibration factor.

5. A method for calibrating a SQUID system having a second order gradiometer, said method comprising the steps of:
   providing a second-order gradiometer associated with a respective SQUID, said second-order gradiometer having a pick-up coil, a compensation coil and a central coil, said central coil having a central coil plane;
   placing a first calibration coil having a first winding sense at an exterior axial portion of said second-order gradiometer at a first distance from said pick-up coil, coil planes of said first calibration coil and said pick-up coil lying parallel to one another;
   placing a second calibration coil having a second winding sense identical to said first winding sense at an exterior axial portion of said second-order gradiometer at a second distance from said compensation coil, said first distance being equal to said second distance, coil planes of said second calibration coil and said compensation coil lying parallel to one another;
   placing a third calibration coil between said first and second calibration coils, said third calibration coil having a coil plane coinciding with said central coil plane, said third calibration coil having a third winding sense opposite said first and second winding senses;
   penetrating each of said pick-up, compensation and central coils with magnetic fields respectively generated by said first, second and third calibration coils so as to produce a net uniform magnetic field component across said pick-up, compensation and central coils which is negligible and further to produce a first-order magnetic field gradient which is negligible.

6. A method as recited in claim 5, further comprising the steps of:
   numerically calculating a net gradient magnetic field value produced across said detection, compensation and central coils by said first, second and third calibration coils;
   measuring an output voltage at said respective SQUID; and,
   dividing said net magnetic field value by said output voltage to calculate a calibration factor.

* * * * *